(12) United States Patent
Johnson et al.

(10) Patent No.: US 6,303,864 B1
(45) Date of Patent: Oct. 16, 2001

(54) CONNECTOR ARRANGEMENT AND CONNECTING METHOD FOR CABLE MANAGEMENT ARMS

(75) Inventors: Chris Stephen Johnson, Austin; Robert F. Gontarek, Round Rock, both of TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 09/470,280

(22) Filed: Dec. 22, 1999

(51) Int. Cl.[7] .................................................. H01B 7/06
(52) U.S. Cl. ..................... 174/69; 174/68.3; 174/72 A; 174/99 E
(58) Field of Search ..................... 174/68.3, 69, 72 A, 174/99 E; 361/826

(56) References Cited

U.S. PATENT DOCUMENTS

| | | |
|---|---|---|
| 4,614,383 | 9/1986 | Polley et al. . |
| 5,587,877 | 12/1996 | Ryan et al. . |
| 5,655,738 | 8/1997 | Ragsdale et al. . |
| 5,893,539 | 4/1999 | Tran et al. . |
| 5,924,898 * | 7/1999 | Dutton et al. ................. 439/701 |
| 5,964,611 | 10/1999 | Jacob et al. . |
| 6,070,742 * | 6/2000 | McAnally et al. ................. 211/26 |

* cited by examiner

*Primary Examiner*—Dean A. Reichard
*Assistant Examiner*—W. David Walkenhorst
(74) *Attorney, Agent, or Firm*—Russell D. Culbertson; Shaffer & Culbertson, LLP

(57) ABSTRACT

A cable management arm (10) according to the invention attaches to a receiver arrangement (15) associated with some structure adapted to slide with a component (12) mounted in a rack structure (11). The receiver arrangement (15) includes an edge feature (40) and a tab receiving feature (41). A connector arrangement (14) includes a connector base (45) with a connector member (46, 47) extending from one side of the connector base and having an intermediate section (51) and a distal section (50). The distal section (50) of the connector member (46, 47) is adapted to hook over the edge feature when the intermediate section is positioned adjacent to, or flush against the edge feature. A retainer member (54) is also connected to the connector base with a retainer tab (55) extending from the retainer member. The retainer tab (55) cooperates with the tab receiving feature (41) to hold the connector member (46, 47) in a connected position.

14 Claims, 4 Drawing Sheets

CONNECTOR ARRANGEMENT AND CONNECTING METHOD FOR CABLE MANAGEMENT ARMS

TECHNICAL FIELD OF THE INVENTION

This invention relates to rack-mounted electronic systems and, more particularly, to a cable management arm connector arrangement used in rack-mounted computer systems.

BACKGROUND OF THE INVENTION

Computer systems and other electronic systems may be mounted in rack structures. In a rack-mounted system, various system components may be stacked vertically, one atop another, so that the system takes up less floor space. Individual components are typically mounted in the rack structure with a slide arrangement. The slide arrangement allows the respective component to slide into the rack structure to an operating position or slide outwardly from the rack to a service position. Extending the component to the service position makes the component readily accessible for reparations, upgrades, or other service operations.

In rack-mounted computer systems, individually mounted components may include servers, other computers, and direct access storage devices such as disk drives and RAID subsystems, for example. These individually mounted components may themselves include modular subcomponents which may be modified or exchanged without detaching the entire individually mounted component from the rack. In the rack-mounted computer system example, rack-mounted servers or computers may include redundant modular power supplies or disk drives. These subcomponents may be "hot-swapable," meaning that the subcomponents may be removed and replaced without disconnecting the component from the system and interrupting system operation.

Each individually mounted component is generally connected to a variety of cables. These cables commonly include power cables which route electrical power to the component, and also include communications cables which allow the rack-mounted component to communicate with other components or peripheral devices. For example, a typical rack-mounted processor component may use separate cables to connect to a video monitor, a printer, a local area network (LAN), and external storage devices such as disk drives, RAID drives, optical disks, and tape drives. The required cables usually connect at the back of the rack-mounted component.

In rack-mounted systems in which the individual components may slide in and out of the rack, the cables required for the individual components must be arranged so that the cables do not interfere with the movement of the component in the rack. In order to accommodate the desired movement of the component, cables which connect to the component must be long enough to allow the component to slide out to its extended service position. Yet the cables must be arranged so they do not become entangled when the component is in the retracted operating position.

Devices known as cable arms or cable management arms are commonly used in rackmounted systems to hold the various cables leading to a component, while allowing the component to be moved in the rack as desired. These cable management arms include two or more rigid segments which are connected together by hinges. The segment at one end of the arm is hinged to a back area of the rack while the segment at the opposite end of the arm is hinged to the back portion of the rack-mounted component or some structure adapted to move with the component. This arrangement of rigid segments and hinges allows the segments of the cable management arm to fold together to lay substantially flat against the back of the component when the component is in the retracted operating position. When the component slides to the service position, however, the segments may separate or pivot apart to allow the cable management arm to extend. Cables which must be connected to the back of the component may be secured to the cable management arm so that the cables move with the arm as it unfolds or folds in response to movement of the component within the rack. Thus, by securing the cables to the arm, the cables can be managed without interfering with the movement of the component within the rack.

Since cable management arms may carry a large number of cables and must articulate in a very confined space, the various segments which make up the arm must be fairly strong and the hinges must not allow significant play aside from the desired articulation. The connections which connect the cable management arm to the rack and to the component must also be sturdy and secure. To provide these secure connections, prior cable management arms have used fasteners such as screws which may be installed or removed only with the aid of tools.

In some cases, the end of the cable management arm connected to the rack-mounted component or structure associated with the component may, due to limited space at the back of the component, block access to modular subcomponents which are mounted on the rack-mounted component. This is particularly true in compact rack-mounted systems in which the individual components are relatively narrow. In these cases, the width of the cable management arm may be nearly equal to the width of the component itself. Thus, although the cable management arm allows the component to be extended from the rack for servicing, the cable management arm itself may interfere with service access. Where the cable management arm interferes with service access, it must be at least partially disconnected to allow the desired access. However, the prior cable management arms required a technician to use a suitable tool to disconnect the cable arm, and then reconnect the arm after the service operation. The prior art cable management arm connecting arrangements not only required a technician to carry the appropriate tools, but also wasted valuable time as the technician disconnected and then reconnected the arm.

SUMMARY OF THE INVENTION

It is an object of the invention to provide a cable management arm and connector arrangement which overcomes the above-described problems and others associated with prior cable management arms. More particularly, it is an object of the invention to provide a connector arrangement for quickly and securely connecting a cable management arm or quickly disconnecting the arm without the use of tools. The invention also encompasses a method for connecting a cable management arm in a computer system.

A cable management arm according to the invention attaches between a receiver arrangement and a rear portion of the rack. The receiver arrangement is associated with some structure adapted to slide with a component mounted in the rack. A suitable fastener at one end of the cable management arm connects that end of the arm to the rear portion of the rack, while the connector arrangement according to the invention resides at the opposite end of the cable management arm and cooperates with the receiver arrangement to provide a secure connection between the cable management arm and the slidable component. Yet the connector arrangement according to the invention may be connected with the receiver arrangement and disconnected easily by hand without requiring any tools.

The receiver arrangement includes an edge feature and a tab receiving feature. The connector arrangement includes a connector base which preferably includes a portion of a hinge structure to which one segment of the cable management arm is pivotally connected. A connector member extends from one side of the connector base and includes an intermediate section and a distal section. The distal section of the connector member is adapted to hook over the edge feature included in the receiver arrangement when the intermediate section is positioned adjacent to, or flush against the edge feature. The connector arrangement according to the invention also includes a retainer member connected to the connector base and a retainer tab extending from the retainer member. The retainer tab is positioned on the retainer member so that it is spaced apart from the connector member a distance substantially equal to the distance between the tab receiving feature and the edge feature of the receiving arrangement.

With this connector arrangement, the intermediate section of the connector member may be positioned adjacent to the edge feature with the distal section hooked over the edge feature. When the connector member is placed in this position, the tab catches on the tab receiving feature associated with the receiver arrangement. With the distal section of the connector member hooked over the edge feature and the tab caught in the tab receiving feature, the distal section remains securely hooked over the edge feature and cannot be removed until the tab is removed from the tab receiving feature. Thus, the connector arrangement cooperates with the receiver arrangement to provide a secure yet easily removable connection between the connector base and the rack-mounted component. The end of the cable management arm near the back of the component may be disconnected by hand to gain access to subcomponents which may reside near the connection, and then reconnected by hand.

In the preferred form of the invention, the receiver arrangement includes an elongated slot and the edge feature comprises one or both edges defined by the slot. The connector member in this preferred embodiment comprises a T-shaped member with the intermediate section forming the base of the T shape and the distal section forming the top of the T shape. Regardless of the nature of the connector member, the retainer member preferably comprises a member which biases the tab into the tab receiving feature when the connector base is positioned against the receiver arrangement. A release member may be connected to the retainer member to facilitate manipulating the retainer member to withdraw the retainer tab from contact with the tab receiving feature. Although the receiver arrangement may include only a single slot for cooperating with a single connector member, additional slots may be included in the arrangement, each additional slot cooperating with an additional connector member to provide an even more secure connection.

These and other objects, advantages, and features of the invention will be apparent from the following description of the preferred embodiments, considered along with the accompanying drawings.

DESCRIPTION OF THE PREFERRED EMBODIMENTS

Figure 1:
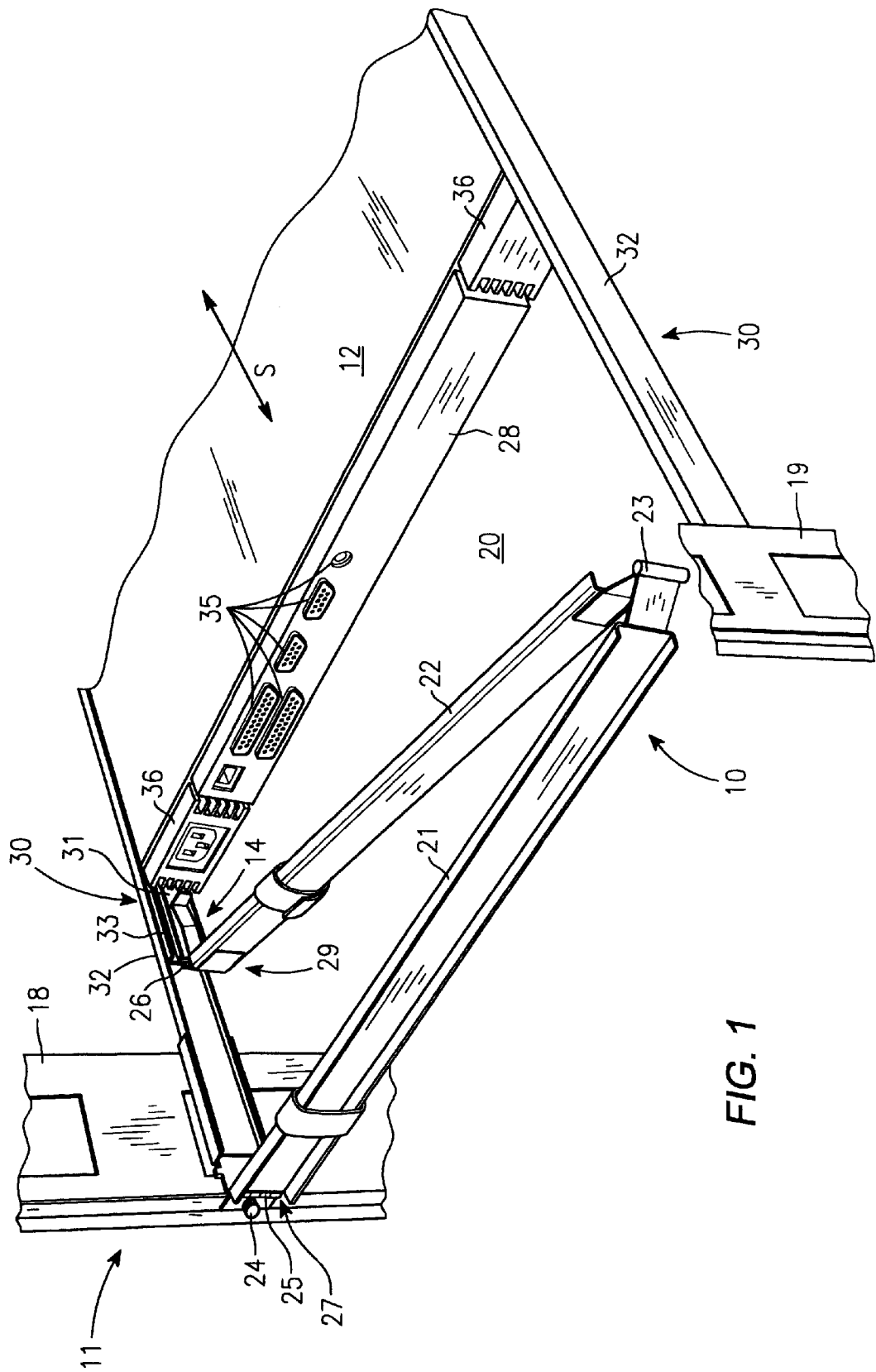
FIG. 1 is a view in perspective of cable management arm embodying the principles of the invention connected in a rack-mounted computer system.
Figure 2:
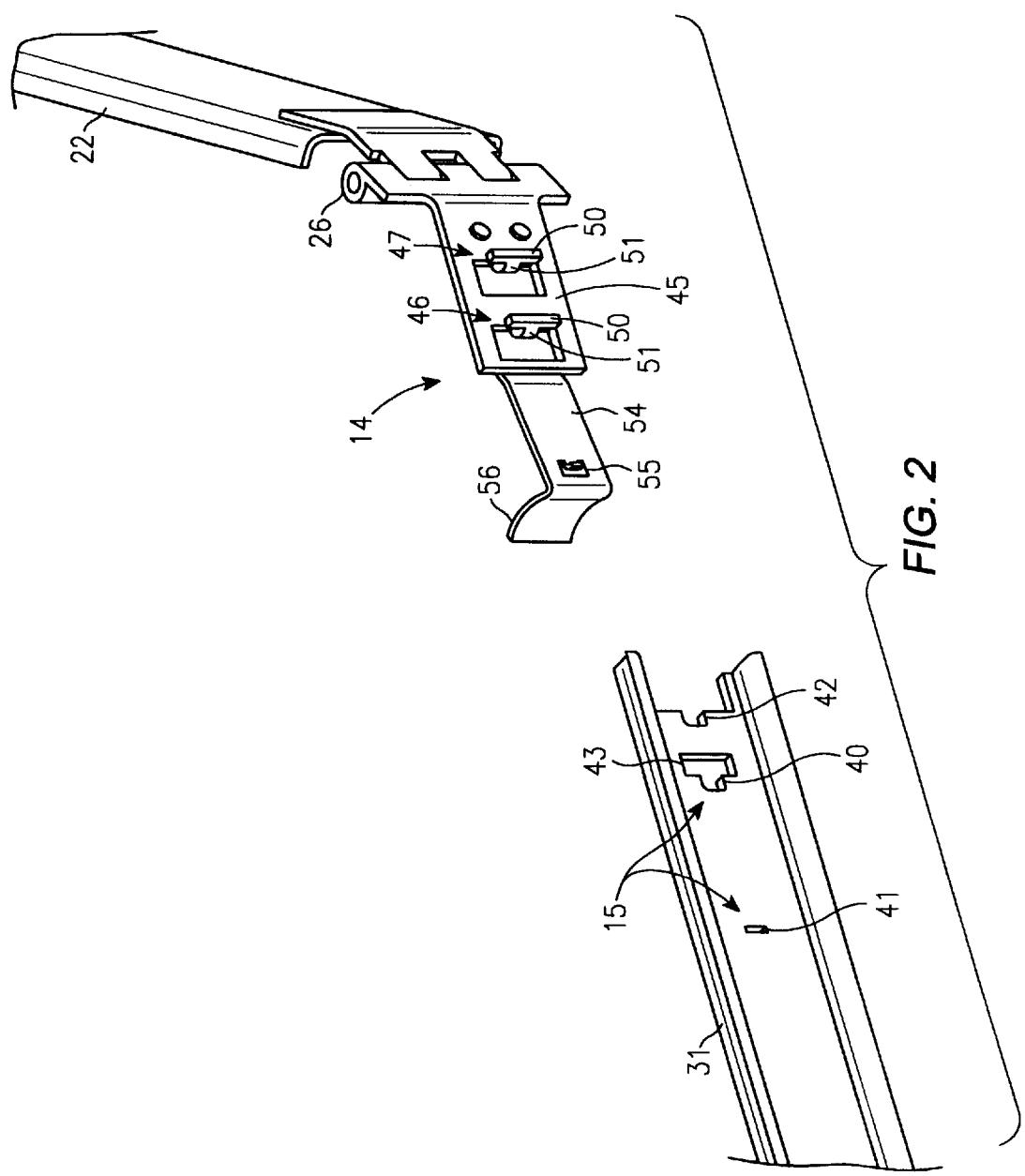
FIG. 2 is an enlarged view in perspective of a portion of the cable management arm disconnected from the chassis slide.
Figure 3:
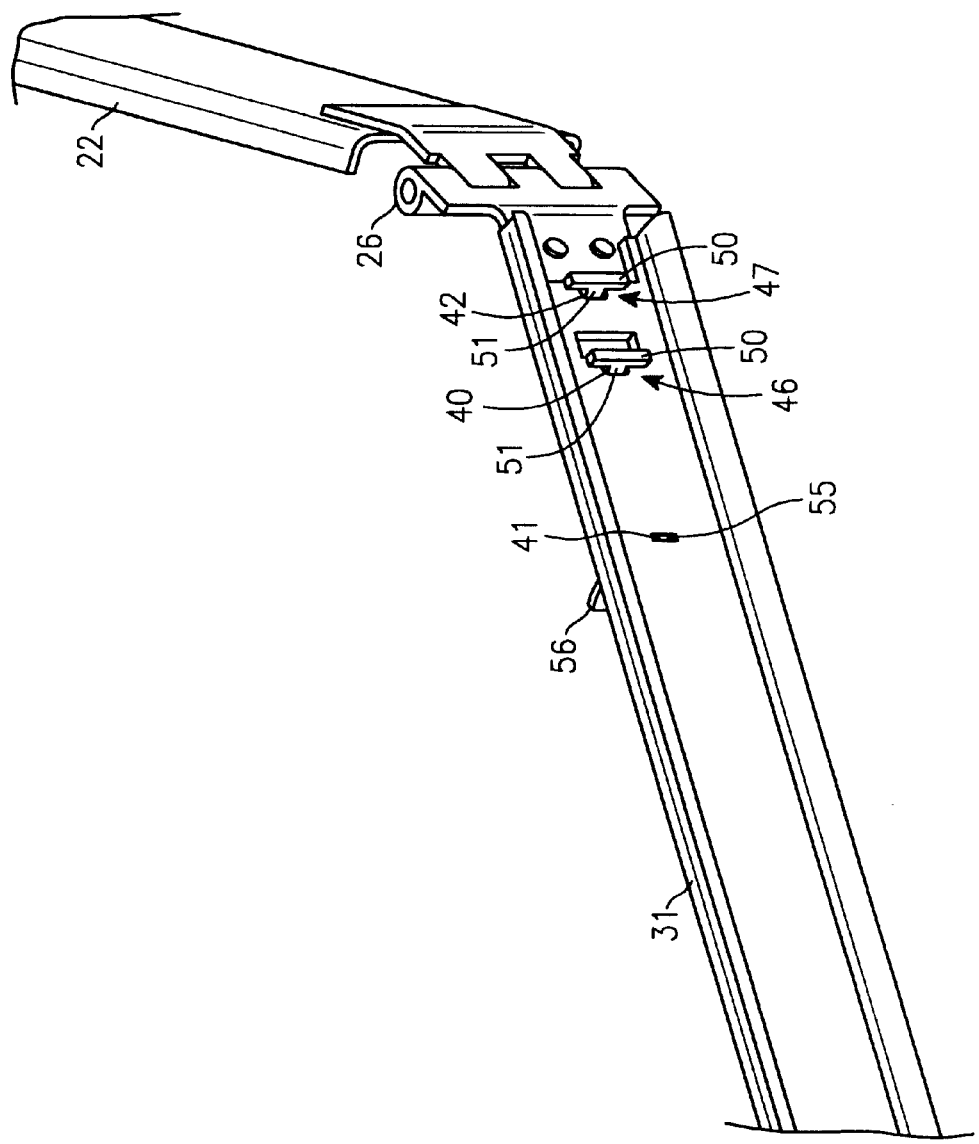
FIG. 3 is an enlarged view in perspective similar to FIG. 2, but with the cable management arm connector connected to the chassis slide.
Figure 4:
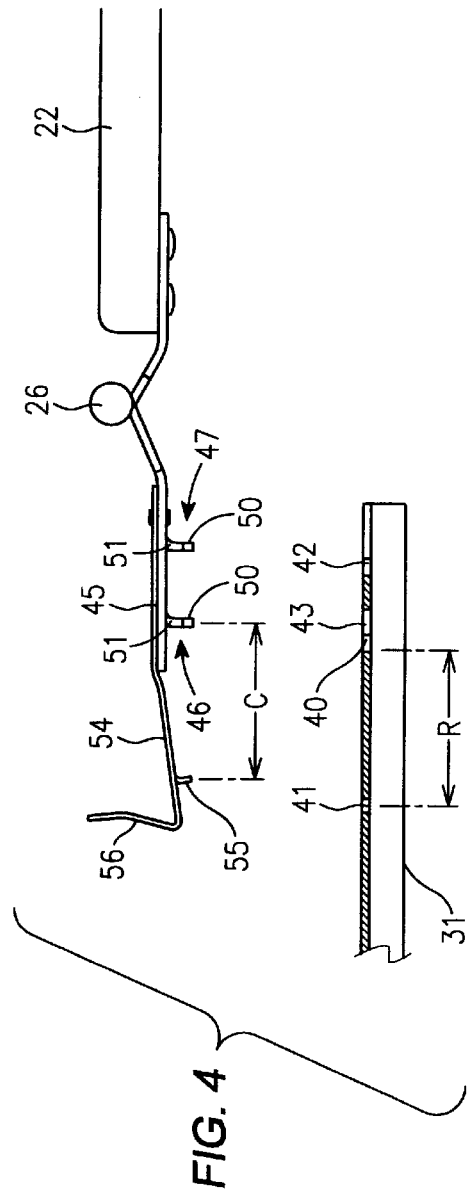
FIG. 4 is a side view of the cable management arm connector separated from the chassis slide, with the chassis slide shown in longitudinal section.
Figure 5:
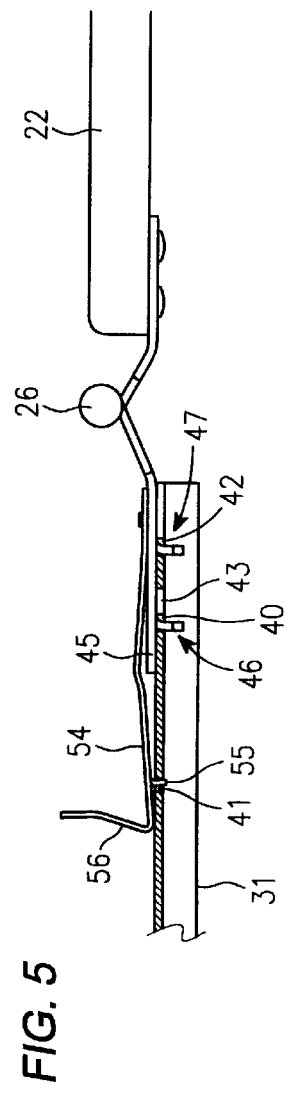
FIG. 5 is a side view similar to FIG. 4, but with the cable management arm connector fully connected to the chassis slide.

FIGS. 1 through 5 show a cable management arm 10 embodying the principles of the invention. FIG. 1 shows cable management arm 10 connected between a rack structure 11 and a component 12 slidably mounted in the rack structure. FIGS. 2 through 5 show enlarged views of a connector arrangement 14 and receiver arrangement 15 according to the invention.

Referring to FIG. 1, cable management arm 10 is used in a rack-mounted electronics system contained in rack structure 11. Although the invention will be described in this disclosure with reference to a rack-mounted computer system which includes computer system component 12, those skilled in the art will appreciate that a cable management arm embodying the principles of the invention may be used in other types of rack-mounted systems. Also, since the invention may be described with reference to only a single component such as component 12, other system components are omitted from the drawings.

Rack structure 11 includes two lateral sides 18 and 19 which define an open area 20 for receiving system components such as component 12. Component 12 is slidably mounted between the lateral sides 18 and 19 of rack structure 11 and is adapted to slide in the direction of arrow S show in FIG. 1. Cable management arm 10 includes two segments 21 and 22 which are hinged or pivotally connected together at center pivot connection 23. Cable management arm 10 also includes a fastener 24 for fastening a first end 27 of the arm to the rack structure, while connector arrangement 14 and receiver arrangement 15 cooperate to connect a second end 29 of the arm to some structure which is adapted to slide with component 12. A first hinge or pivot connection 25 is associated with fastener 24 to allow segment 21 pivot with respect to the fastener. A second hinge or pivot connection 26 connects segment 22 to connector arrangement 14. It will be appreciated that substantially any type of pivot or hinge structures may be used for hinges 23, 25, and 26. Preferably, each hinge structure is adapted to pivot only about a single axis, each axis extending substantially perpendicular to the slide direction S in FIG. 1.

FIG. 1 shows component 12 extended somewhat toward its service position. This partially extended position shows cable management arm 10 partially extended, with segments 21 and 22 spread somewhat apart. Those skilled in the art will appreciate that when component 12 is moved to its fully retracted operating position, segments 21 and 22 will fold together to a closed position, with both segments extending generally parallel to the back surface 28 of the component.

Numerous different slide arrangements may be used to connect a component in a rackmounted system to allow the component to slide between the desired service position and operating position. The illustrated slide connection is made with two separate slide structures 30, one on each lateral side of component 12. Each slide structure 30 includes an inner or chassis slide 31. Each respective chassis slide 31 is rigidly connected to a different lateral side of component 12. Each slide structure 30 also includes a track member 32. One such track member 32 is rigidly connected on each lateral side 18 and 19 of the rack structure 11. Each slide structure 30 also includes an intermediate slide member 33. The intermediate slide member 33 in each slide structure is positioned between the respective track member 32 and chassis slide 31. The intermediate slide member 33 is adapted to slide with respect to its associated track member 32, while the chassis slide 31 in the slide structure is adapted to slide with respect to the intermediate slide member. This slide structure 30 allows component 12 to be extended fully from the front of the rack structure to the service position. Stop mechanisms, release mechanisms, and other elements may be included in slide structures 30. However, these additional elements need not be shown to describe the present invention and are therefore omitted from the figures so as not to obscure the invention in unnecessary detail.

Connector arrangement 14 cooperates with receiver arrangement 15 to securely connect the second end 29 of cable management arm 10 near the back surface 28 of component 12 so that the second end of the cable management arm may move with the component as it slides with respect to rack 11. In the illustrated form of the invention, receiver arrangement 15 is formed on one chassis slide 31 at an end of the chassis slide extending past the back surface 28 of component 12. Those skilled in the art will appreciate that the receiver arrangement need not be formed on chassis slide 31, but may alternatively be formed on or otherwise connected to the back surface 28 of component 12 itself. Also, receiver arrangement 15 may be formed on either or both chassis slides 31 so that the cable management arm may be connected on either lateral side of component 12.

It will be noted with reference to FIG. 1 that the end of the cable management arm 10 which is adapted to move with component 12, second end 29, connects near the back surface 28 of the component. The illustrated component 12 includes a number of connectors 35 on back surface 28 for making connections with various cables (not shown) which are to be carried by cable management arm 10. Component 12 also includes two modular subcomponents 36 positioned near the lateral sides of the component. One of the subcomponents 36 is positioned adjacent to second end 29 of cable management arm 10. With the cable management arm connected at the back of component 12, the cable management arm blocks access to the adjacent modular subcomponent 36 so that the subcomponent cannot be removed. The present invention allows second end 29 of cable management arm 10 to be easily disconnected from component 12 without the use of tools, and moved sufficiently out of the way to allow modular subcomponent 36 to be removed and replaced. Once module 36 is replaced, cable management arm 10 may be quickly reconnected by hand so that component 12 may be quickly returned to its operating position in rack 11.

Referring now to FIGS. 2 through 5, receiver arrangement 15 includes an edge feature which, in this case, comprises one or both edges of slot 40 formed in chassis slide 31. Receiver arrangement 15 also includes a tab receiving feature comprising an opening 41 formed in chassis slide 31. Although one edge feature is sufficient for making a connection according to the invention, the illustrated form of the invention includes additional edge features associated with an additional slot 42. Slot 40 includes an enlarged section 43 at one end while additional slot 42 is open at one end.

Connector arrangement 14 includes a connector base 45. Connector base 45 includes a portion of hinge structure 26 which connects the connector arrangement to segment 22 of cable management arm 10. A connector member 46 extends from base 45, and is adapted to cooperate with the edge features formed by slot 40. In the illustrated form of the invention, an additional connector member 47 extends from base 45 in position to cooperate with additional slot 42. Each connector member 46 and 47 includes an enlarged distal section 50 and an intermediate section 51. Intermediate section 51 extends sufficiently from connector base 45 to allow the respective distal section 50 to hook over the respective edge feature formed by the respective slot 40 or 42.

In the illustrated, preferred form of the invention, each connector member 46 and 47 comprises a T-shaped member. The base of the T shape forms the immediate section 51 of the respective connector member, while the top of the T shape forms the distal section 50 of the respective connector member. As shown particularly in FIG. 3, the intermediate section 51 of each connector member 46 and 47 is narrow enough so that it may slide into the respective slot 40 or 42 with both sides of the distal section 50 hooked over the edges of the respective slot.

Connector arrangement 14 further includes a retainer member 54, a retainer tab 55 connected to the retainer member, and preferably a retainer release member 56. According to the invention, retainer tab 55 is spaced apart from connector member 46 a distance C shown in FIG. 4 substantially equal to the distance R between tab receiving feature 41 and the edge feature, in this case a portion of slot 40. When connector member 46 is positioned through opening 43 and moved to into slot 40 to the position shown in FIGS. 3 and 5, retainer tab 55 catches on tab receiving feature and prevents the connector member from moving with respect to the slot. In this connected position shown in FIGS. 3 and 5, the distal section 50 of connector member 46 is hooked over the edges of slot 40 and prevents the connector base 45 from being separated from the structure in which receiver arrangement 15 is formed. Thus, the connector arrangement 14 and receiver arrangement cooperate to make a secure connection between cable management arm 10 and chassis slide 31. In the preferred form of the invention, retainer member 54 comprises a material which biases retainer tab 55 into tab receiving feature 41 so that it may be removed from the feature only by actively lifting the retainer member. Lifting retainer member 54 in this fashion may be performed easily using retainer release member 56 connected to the retainer member. Once retainer tab 55 is withdrawn from tab receiving feature 41, connector base 45 may be moved to slide connector member 46 out of slot 40 and withdraw the connector member through enlarged section 43.

In the illustrated form of the invention, additional connector member 47 cooperates with additional slot 42 in the same manner that connector member 46 cooperates with slot 40. The two connector members generally strengthen the resulting connection. However, it will be appreciated that the invention may be practiced with a single connector member, either connector member 46 or additional connector member 47.

The connector arrangement 14 may be formed from any suitable material including metals or plastics. In one preferred form of the invention, the connector base 45 and connector members 46 and 47 are formed from a suitable metal using a stamping process.

The above described preferred embodiments are intended to illustrate the principles of the invention, but not to limit the scope of the invention. Various other embodiments and modifications to these preferred embodiments may be made by those skilled in the art without departing from the scope of the following claims. For example, the edge feature in the receiver arrangement need not be associated with a slot. Alternatively, the edge feature may simply comprise an end such as the end of chassis slide 31, and the connector member may comprise an L shaped member adapted to hook over the edge when the retainer tab is captured in the tab receiving feature.

What is claimed is:

1. A cable management arm connecting apparatus adapted to attach to a receiver arrangement which includes an edge feature and a tab receiving feature, the connecting apparatus comprising:
    (a) a connector base including a hinge component;
    (b) a connector member extending from a first side of the connector base, the connector member having an intermediate section and also having a distal section which is adapted to hook over the edge feature of the receiving arrangement with the intermediate section residing adjacent to the edge feature;
    (c) a retainer member connected to the connector base; and
    (d) a retainer tab connected to the retainer member, the retainer tab being spaced apart from the connector member a distance substantially equal to the distance between the tab receiving feature and the edge feature so that the retainer tab may catch on the tab receiving feature when the distal section of the connector member is hooked over the edge feature.

2. The apparatus of claim 1 wherein the edge feature comprises the edge of a slot and the intermediate section of the connector member is more narrow than the slot, while the distal section of the connector member is wider than the slot so that a portion of the distal section extends over the slot edge when the intermediate section reside in the slot.

3. The apparatus of claim 2 wherein the connector member comprises a T-shaped member with the intermediate section comprising the base of the T shape and the distal section comprising the top of the T shape.

4. The apparatus of claim 1 wherein the retainer member comprises a member adapted to bias the retainer tab toward the tab receiving feature when the distal section of the connector member is hooked over the edge feature.

5. The apparatus of claim 1 wherein the retainer member includes a release member projecting from a side of the retainer member opposite a side on which the retainer tab resides.

6. The apparatus of claim 2 wherein the receiving arrangement includes at least one additional slot and wherein the connecting apparatus includes an additional connector member for each additional slot.

7. The apparatus of claim 1 wherein the connector base and connector member are integrally formed.

8. In a computer system having a cable management arm, the improvement comprising:
    (a) a receiver arrangement associated with a computer system chassis, the receiver arrangement including an attachment slot and also including a tab receiving feature spaced apart from the attachment slot;
    (b) a connector base pivotally connected to one end of the cable management arm;
    (c) a connector member extending from a first side of the connector base, the connector member having an intermediate section which is more narrow than the attachment slot and also having a distal section which is wider than the attachment slot, the intermediate section of the connector member being adapted to slide into the attachment slot;
    (d) a retainer member connected to the connector base; and
    (e) a retainer tab connected to the retainer member, the retainer tab being spaced apart from the connector member a distance substantially equal to the distance between the tab receiving feature and the attachment slot so that the retainer tab may catch on the tab receiving feature when the connector member is placed in the attachment slot.

9. The computer system of claim 8 wherein the connector member comprises a T-shaped member with the intermediate section comprising the base of the T shape and the distal section comprising the top of the T shape.

10. The computer system of claim 8 wherein the retainer member comprises a member adapted to bias the retainer tab toward the tab receiving feature when the connector member is received in the attachment slot.

11. The computer system of claim 8 wherein the retainer member includes a release member projecting from a side of the retainer member opposite a side on which the retainer tab resides.

12. The computer system of claim 8 wherein the receiving arrangement includes at least one additional slot, and further including an additional connector member for each additional slot.

13. The computer system of claim 8 wherein the connector base comprises a metal plate and the connector member is stamped from the metal plate.

14. The computer system of claim 8 wherein the receiving arrangement includes an enlarged opening adjacent to the attachment slot, the enlarged opening adapted to receive the distal end of the connector member.

* * * * *